United States Patent
Slater, Jr. et al.

(10) Patent No.: US 9,608,166 B2
(45) Date of Patent: Mar. 28, 2017

(54) LOCALIZED ANNEALING OF METAL-SILICON CARBIDE OHMIC CONTACTS AND DEVICES SO FORMED

(75) Inventors: David B. Slater, Jr., Durham, NC (US); John Edmond, Cary, NC (US); Matthew Donofrio, Raleigh, NC (US)

(73) Assignee: Cree, Inc., Durham, NC (US)

( * ) Notice: Subject to any disclaimer, the term of this patent is extended or adjusted under 35 U.S.C. 154(b) by 1147 days.

(21) Appl. No.: 13/417,913

(22) Filed: Mar. 12, 2012

(65) Prior Publication Data

US 2012/0164765 A1 Jun. 28, 2012

Related U.S. Application Data

(63) Continuation of application No. 10/916,113, filed on Aug. 11, 2004, now abandoned.

(60) Provisional application No. 60/495,189, filed on Aug. 14, 2003, provisional application No. 60/495,284, filed on Aug. 15, 2003.

(51) Int. Cl.
| | |
|---|---|
| *H01L 21/768* | (2006.01) |
| *H01L 33/40* | (2010.01) |
| *H01L 21/04* | (2006.01) |
| *H01L 33/00* | (2010.01) |
| *H01L 21/027* | (2006.01) |
| *H01L 21/263* | (2006.01) |
| *H01L 21/268* | (2006.01) |
| *H01L 33/34* | (2010.01) |

(52) U.S. Cl.
CPC .......... *H01L 33/40* (2013.01); *H01L 21/0485* (2013.01); *H01L 33/0095* (2013.01); *H01L 21/0272* (2013.01); *H01L 21/268* (2013.01); *H01L 21/2636* (2013.01); *H01L 33/34* (2013.01); *H01L 2924/0002* (2013.01)

(58) Field of Classification Search
CPC ......... H01L 2924/0002; H01L 21/0485; H01L 2924/00; H01L 29/66545; H01L 21/268
USPC ......... 257/369, E29.275, 347; 438/460, 931, 438/602, 113, 459
See application file for complete search history.

(56) References Cited

U.S. PATENT DOCUMENTS

| | | |
|---|---|---|
| 4,042,552 A | 8/1977 | Grucza |
| 4,107,238 A | 8/1978 | Roper et al. |
| 4,141,941 A | 2/1979 | Travnicek |

(Continued)

FOREIGN PATENT DOCUMENTS

| | | |
|---|---|---|
| JP | S56-158454 A | 12/1981 |
| JP | S61-236169 A | 10/1986 |

(Continued)

OTHER PUBLICATIONS

International Search Report for PCT/US 2004/026210, mailing date Dec. 6, 2004.

(Continued)

*Primary Examiner* — Jaehwan Oh
(74) *Attorney, Agent, or Firm* — Myers Bigel, P.A.

(57) ABSTRACT

A method of forming an ohmic contact for a semiconductor device can be provided by thinning a substrate to provide a reduced thickness substrate and providing a metal on the reduced thickness substrate. Laser annealing can be performed at a location of the metal and the reduced thickness substrate at an energy level to form a metal-substrate material to provide the ohmic contact thereat.

36 Claims, 12 Drawing Sheets

(56) References Cited

U.S. PATENT DOCUMENTS

| | | | |
|---|---|---|---|
| 4,456,490 A * | 6/1984 | Dutta | H01L 21/268 148/DIG. 91 |
| 4,562,018 A | 12/1985 | Neefe | |
| 4,612,408 A * | 9/1986 | Moddel | H01L 27/14643 136/244 |
| 4,672,740 A | 6/1987 | Shirai et al. | |
| 4,826,424 A | 5/1989 | Arai et al. | |
| 4,918,497 A | 4/1990 | Edmond | |
| 4,966,862 A | 10/1990 | Edmond | |
| 5,027,168 A | 6/1991 | Edmond | |
| 5,087,949 A | 2/1992 | Haitz | |
| 5,110,278 A | 5/1992 | Tait et al. | |
| 5,143,660 A | 9/1992 | Hamilton et al. | |
| 5,210,051 A | 5/1993 | Carter, Jr. | |
| 5,277,840 A | 1/1994 | Osaka et al. | |
| 5,338,944 A | 8/1994 | Edmond et al. | |
| 5,374,668 A | 12/1994 | Kanemura et al. | |
| 5,393,993 A | 2/1995 | Edmond et al. | |
| 5,416,342 A | 5/1995 | Edmond et al. | |
| 5,523,589 A | 6/1996 | Edmond et al. | |
| 5,604,135 A | 2/1997 | Edmond et al. | |
| 5,631,190 A | 5/1997 | Negley | |
| 5,739,554 A | 4/1998 | Edmond et al. | |
| 5,753,730 A | 5/1998 | Nagata et al. | |
| 5,813,753 A | 9/1998 | Vriens et al. | |
| 5,858,278 A | 1/1999 | Itoh et al. | |
| 5,882,553 A | 3/1999 | Prophet et al. | |
| 5,912,477 A | 6/1999 | Negley | |
| 5,959,316 A | 9/1999 | Lowery | |
| 5,968,422 A | 10/1999 | Kennedy | |
| 6,069,440 A | 5/2000 | Shimizu et al. | |
| 6,110,813 A * | 8/2000 | Ota | H01L 21/0485 257/E21.062 |
| 6,120,600 A | 9/2000 | Edmond et al. | |
| 6,156,242 A | 12/2000 | Saito et al. | |
| 6,177,688 B1 | 1/2001 | Linthicum et al. | |
| 6,187,606 B1 | 2/2001 | Edmond et al. | |
| 6,201,262 B1 | 3/2001 | Edmond et al. | |
| 6,252,254 B1 | 6/2001 | Soules et al. | |
| 6,274,889 B1 * | 8/2001 | Ota | H01L 21/0485 257/12 |
| 6,297,138 B1 * | 10/2001 | Rimai | C23C 14/16 257/E21.066 |
| 6,329,676 B1 | 12/2001 | Takayama et al. | |
| 6,373,188 B1 | 4/2002 | Johnson et al. | |
| 6,383,417 B1 | 5/2002 | Paulson et al. | |
| 6,391,231 B1 | 5/2002 | Evans et al. | |
| 6,404,125 B1 | 6/2002 | Garbuzov et al. | |
| 6,853,010 B2 | 2/2005 | Slater, Jr. et al. | |
| 6,878,574 B2 | 4/2005 | Tomoda et al. | |
| 7,264,378 B2 | 9/2007 | Loh | |
| 7,297,626 B1 * | 11/2007 | Cole | H01L 21/0485 257/77 |
| 7,851,343 B2 * | 12/2010 | Mayer | H01L 21/0485 257/E21.294 |
| 2001/0010702 A1 | 8/2001 | Tanaka | |
| 2001/0017409 A1 | 8/2001 | Hiroki et al. | |
| 2001/0019133 A1 | 9/2001 | Konuma et al. | |
| 2001/0027001 A1 | 10/2001 | Yoshida et al. | |
| 2001/0045932 A1 | 11/2001 | Mukae | |
| 2001/0050371 A1 | 12/2001 | Odaki et al. | |
| 2002/0019084 A1 | 2/2002 | Francis et al. | |
| 2002/0027716 A1 | 3/2002 | Tanaki | |
| 2002/0048829 A1 | 4/2002 | Yamazaki et al. | |
| 2002/0094612 A1 | 7/2002 | Nakamura et al. | |
| 2002/0102098 A1 | 8/2002 | Camm et al. | |
| 2002/0119585 A1 | 8/2002 | Yamazaki et al. | |
| 2002/0121642 A1 | 9/2002 | Doverspike et al. | |
| 2002/0123164 A1 | 9/2002 | Slater, Jr. et al. | |
| 2002/0125480 A1 | 9/2002 | Nakamura et al. | |
| 2002/0145145 A1 * | 10/2002 | Nakashima | H01L 21/0485 257/77 |
| 2002/0146872 A1 | 10/2002 | Arai et al. | |
| 2002/0158288 A1 | 10/2002 | Yamesaki et al. | |
| 2002/0182783 A1 | 12/2002 | Takayama et al. | |
| 2002/0192914 A1 | 12/2002 | Kizilyalli et al. | |
| 2002/0192931 A1 | 12/2002 | Hayakawa | |
| 2003/0006418 A1 | 1/2003 | Emerson et al. | |
| 2003/0010980 A1 | 1/2003 | Yamazaki et al. | |
| 2003/0013280 A1 | 1/2003 | Yamazaka | |
| 2003/0022471 A1 | 1/2003 | Taketomi et al. | |
| 2003/0059990 A1 | 3/2003 | Yamazaki | |
| 2003/0080099 A1 | 5/2003 | Tanaka et al. | |
| 2003/0087522 A1 | 5/2003 | Ngo et al. | |
| 2003/0090481 A1 | 5/2003 | Kimura | |
| 2003/0094641 A1 | 5/2003 | Gonzalez et al. | |
| 2003/0117352 A1 | 6/2003 | Kimura | |
| 2003/0132931 A1 | 7/2003 | Kimura et al. | |
| 2003/0148594 A1 | 8/2003 | Yamazaki et al. | |
| 2003/0151048 A1 | 8/2003 | Gonzalez et al. | |
| 2003/0164522 A1 | 9/2003 | Kato et al. | |
| 2003/0168437 A1 | 9/2003 | Tanaka | |
| 2003/0173570 A1 | 9/2003 | Yamazaki et al. | |
| 2003/0173575 A1 | 9/2003 | Eisert et al. | |
| 2003/0183875 A1 | 10/2003 | Isobe et al. | |
| 2003/0201496 A1 | 10/2003 | Yamazaki et al. | |
| 2003/0206732 A1 | 11/2003 | Camm et al. | |
| 2004/0012338 A1 | 1/2004 | Smith et al. | |
| 2004/0016969 A1 | 1/2004 | Bohr | |
| 2004/0018672 A1 | 1/2004 | Bohr | |
| 2004/0031961 A1 | 2/2004 | Zhang et al. | |
| 2004/0056915 A1 | 3/2004 | Miyazawa | |
| 2004/0063310 A1 | 4/2004 | Ngo et al. | |
| 2004/0079923 A1 | 4/2004 | Yamazaki et al. | |
| 2004/0080474 A1 | 4/2004 | Kimura | |
| 2007/0066039 A1 * | 3/2007 | Agarwal | H01L 21/0485 438/534 |

FOREIGN PATENT DOCUMENTS

| | | |
|---|---|---|
| JP | S62-105481 A | 5/1987 |
| JP | S63-239941 A | 10/1988 |
| JP | H03-058481 A | 3/1991 |
| JP | 5-152609 | 6/1993 |
| JP | H05-335270 A | 12/1993 |
| JP | H05335270 | 12/1993 |
| JP | 6-151974 | 5/1994 |
| JP | 6-177429 | 6/1994 |
| JP | 6-244458 | 9/1994 |
| JP | 8-162676 | 6/1996 |
| JP | 8-264468 A | 10/1996 |
| JP | 9-246603 | 9/1997 |
| JP | 10-242513 | 9/1998 |
| JP | 10-284436 | 10/1998 |
| JP | 11-261114 | 9/1999 |
| JP | 11-298047 | 10/1999 |
| JP | 2000-101147 | 4/2000 |
| JP | 2000-174347 | 6/2000 |
| JP | 2000-183405 | 6/2000 |
| JP | 2000-252466 A | 9/2000 |
| JP | 2000-286455 | 10/2000 |
| JP | 2000-286458 | 10/2000 |
| JP | 2000-332365 A | 11/2000 |
| JP | 2001-77427 | 3/2001 |
| JP | 2001-77433 | 3/2001 |
| JP | 2001-144334 | 5/2001 |
| JP | 2001-230453 | 8/2001 |
| JP | 2002-026341 | 1/2002 |
| JP | 2002-118293 | 4/2002 |
| JP | 2002-158378 | 5/2002 |
| JP | 2002-223004 | 8/2002 |
| JP | 2002-261295 A | 9/2002 |
| JP | 2002-280616 | 9/2002 |
| JP | 2003-17755 | 1/2003 |
| JP | 2003-158097 A | 5/2003 |
| JP | 2003-158259 A | 5/2003 |
| JP | 2003197642 | 7/2003 |
| JP | 2003-533051 A | 11/2003 |
| WO | WO 01/61764 A1 | 8/2001 |
| WO | WO 01/86727 | 11/2001 |
| WO | WO 02/059982 | 8/2002 |

(56) References Cited

FOREIGN PATENT DOCUMENTS

OTHER PUBLICATIONS

Craford, *Overview of Device Issues in High-Brightness Light-Emitting Diodes*, Chapter, *High Brightness Light Emitting Diodes: Semiconductors and Semimetals*, vol. 48, Stringfellow et al. ed., Academic Press, 1997, pp. 47-63.
Eryu O. et al., "Formation of an ohmic electrode in SiC using a pulsed laser irradiation method", *Nuclear Instruments & Methods in Physics Research, Section B: Beam Interactions With Materials and Atoms, Elsevier, Amsterdam, NL.*, vol. 121, No. 1, Jan. 1, 1997, pp. 419-421.
European Communication Corresponding to Application No. 04 780 967.8-1235; Dated Jun. 20, 2011; 6 Pages.
International Search Report, PCT/US03/27912, Jan. 30, 2004.
Kalinina, E.V. "Effect of Ultrashort Laser Pulses on the Electrophysical Properties of Silicon Carbide," *Soviet Technical Physics Letters USA*, 11(6): Jun. 1985 (Jun. 1985).
Nakashima K. et al., "Formation of Tungsten Ohmic Contact on n-Type 6H-SiC by Pulsed Laser Processes", *Materials Science Forum, Aedermannsdorf, CH*, vol. 264-268, Jan. 1, 1998, pp. 779-782.
Nakashima K. et al., "Improved Ohmic Contacts to 6H-SiC by Pulsed Laser Processing", *Materials Science Forum, Aedermannsdorf, CH*, vol. 338-342, Jan. 1, 2000, pp. 1005-1008; XP008039380.
Ota et al., "Laser Alloying for Ohmic Contacts on SiC at Room Temperature," *Materials Science Forum Trans Tech Publications Switzerland*, vols. 264-268: 783-786 (Aug. 31, 1997).
Selective Metal Deposition by a Resistless Liftoff Process, IBM Technical Disclosure Bulletin, Mar. 1987, pp. 4250.
Translation of Official Action corresponding to Japanese Patent Application No. 2006-523380; Mailing Date: Mar. 4, 2011; 3 pages.

\* cited by examiner

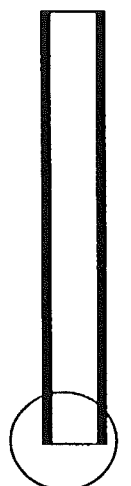
FIGURE 29B
FIGURE 29A
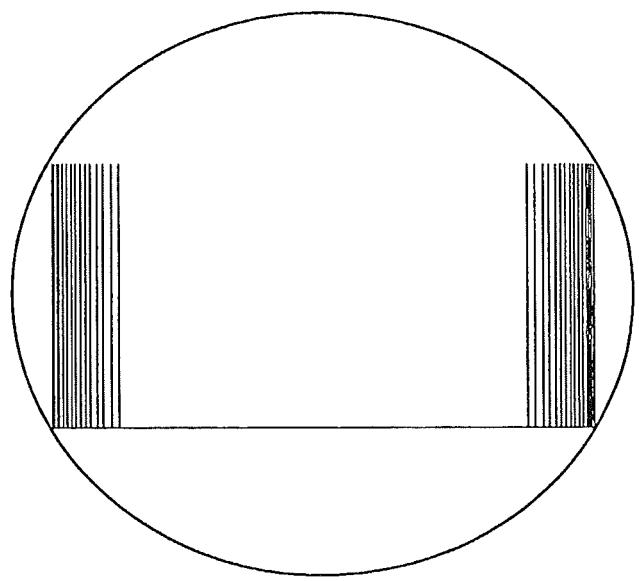
FIGURE 29B

LOCALIZED ANNEALING OF
METAL-SILICON CARBIDE OHMIC
CONTACTS AND DEVICES SO FORMED

CROSS-REFERENCE TO RELATED
APPLICATIONS

This Application is a Continuation of U.S. patent application Ser. No. 10/916,113, filed on Aug. 11, 2004 now abandoned, entitled Localized Annealing of Metal-Silicon Carbide Ohmic Contacts and Devices so Formed, and claims the benefit of U.S. Provisional Application No. 60/495,189, filed Aug. 14, 2003, entitled, Laser Annealing of Ohmic Contacts to SiC, and the benefit of U.S. Provisional Application No. 60/495,284, filed Aug. 15, 2003, entitled Laser Annealing of Ohmic Contacts to SiC, all of which are assigned to the assignee of the present application, the disclosures of which are incorporated herein by reference in their entireties as if set forth fully herein.

FIELD OF THE INVENTION

This invention relates to microelectronic devices, and more particularly, to the fabrication of light emitting devices (LEDs) and LEDs so formed.

BACKGROUND

It is known that the thickness of Silicon-carbide (SiC) substrates in SiC-based light emitting devices can affect the forward voltage needed to operate the devices at a given current level. For example, the SiC-based light emitting diode C450-CB230-E1000 available from Cree, Inc. has a substrate thickness of about 250 μm (+/−25 μm) and has an associated forward operating voltage of about 3.5 volts at about 10 mA forward operating current. Moreover, reducing the thickness of the SiC substrate of an LED may reduce the forward voltage, which may yield reduced power consumption in such diodes.

It is also known that many small electronic devices may incorporate individual devices having reduced thicknesses so that the overall thickness of the electronic device may be reduced. For example, manufacturers of cellular phones may use surface-mounted LED chips to reduce the thickness of the component used to backlight a display of the cellular phone. Accordingly, reducing the thickness of the SiC substrate may also allow the device to be used in these types of small electronic devices.

It is known to form ohmic contacts on SiC at low/room temperature by, for example, implanting ions into a backside of a SiC wafer. However, if an implanted SiC substrate is thinned prior to formation of ohmic contacts, the doped region may be removed during the thinning, which may make the implant superfluous. Accordingly, metals deposited to form ohmic contacts may not have ohmic properties when deposited on the substrate as the implant may be performed in a later step. Ion implantation for the formation of ohmic contacts is discussed, for example, in U.S. patent application Ser. No. 09/787,189, now U.S. Pat. No. 6,884, 644, issued Apr. 26, 2005 and Ser. No. 10/003,331, now U.S. Pat. No. 6,803,243, issued Oct. 12, 2004, the disclosures of which are incorporated herein by reference in their entireties as if set forth fully herein.

It is also known to form metal ohmic contacts by depositing a metal, such as nickel, and annealing the metal at a high temperature (such as temperatures greater than 900° C.). High temperature annealing may damage epitaxial layers of gallium nitride based materials included on the SiC substrate. Accordingly, there is a need for improved methods for forming ohmic contacts to substrates of materials such as SiC, GaN, InGaN or the like.

BRIEF DESCRIPTION OF THE DRAWINGS

FIG. 29A is an exemplary mask having "softened" edge features according to some embodiments according to the invention.

FIG. 29B is a detailed view of a portion shown in FIG. 29A.

SUMMARY

Figure 1:
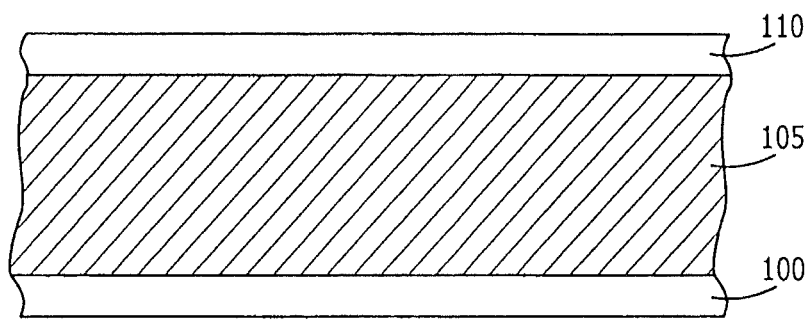
FIGS. 1-4 are cross-sectional views illustrating the formation of metal-silicon carbide ohmic contacts in light emitting devices according to some embodiments of the invention.

Embodiments according to the invention can provide localized annealing of metal-silicon carbide ohmic contacts in semiconductor devices and devices so formed. Pursuant to these embodiments, a contact can be formed by forming a metal on a Silicon Carbide (SiC) layer and annealing an interface location of the metal and the SiC layer to form a metal-SiC material thereat and avoiding annealing at a location on the SiC layer to avoid forming the metal-SiC material thereat. In some embodiments according to the invention, the layer can be a SiC substrate.

In some embodiments according to the invention, the annealing can include annealing at the interface location and annealing according to a pattern to avoid annealing at the location. In some embodiments according to the invention, the interface location can be a first interface location and the location on the SiC substrate can be a second interface location of the metal and the SiC substrate. The annealing can include impinging laser light through an opening in a mask layer onto the metal layer at the first interface location and blocking the laser light with the mask layer opposite the second interface location to avoid annealing at the second interface location.

In some embodiments according to the invention, the annealing can include activating a laser opposite the interface location to impinge laser light onto the metal layer at the interface location and de-activating the laser opposite the location to avoid annealing at the location. In some embodiments according to the invention, forming the metal can include forming the metal on the SiC substrate to form the location spaced-apart from the SiC substrate.

In some embodiments according to the invention, the metal can be formed in a pattern to expose a portion of the SiC substrate at the location and the annealing can include activating a laser opposite the interface location to impinge laser light onto the metal layer at the interface location. Activation of the laser can be maintained opposite the location.

In some embodiments according to the invention, the metal-SiC material at the interface location can be a metal ohmic contact on a back side of the substrate opposite a front side of the substrate having an epitaxial layer thereon. In some embodiments according to the invention, the annealing can include impinging laser light on the interface location to form at least one ohmic contact including opposing ohmic contact boundaries having a non-ohmic contact region therebetween.

In some embodiments according to the invention, the at least one ohmic contact can be a plurality of ohmic contacts including respective opposing ohmic contact boundaries defining a striped pattern forming an oblique angle with a side of the device. In some embodiments according to the invention, the at least one ohmic contact can include a plurality of ohmic contacts including respective opposing ohmic contact boundaries defining a striped pattern parallel to a side of the device.

In some embodiments according to the invention, the at least one ohmic contact can include a plurality of ohmic contacts including respective opposing ohmic contact boundaries defining a circular pattern. In some embodiments according to the invention, the interface location can be a first interface location and the location on the SiC substrate comprises a second interface location of the metal and the SiC substrate. Annealing can include impinging an electron beam on the interface location and blocking the electron beam from impinging the second interface location.

In some embodiments according to the invention, forming a contact for a light emitting device can include forming a metal on a Silicon Carbide (SiC) substrate and laser annealing interface locations of the metal and the SiC substrate according to a pattern to form a metal-SiC material thereat corresponding to the pattern. In some embodiments according to the invention, forming the metal can include forming a blanket metal on the substrate. The laser annealing can include impinging laser light on the interface locations through openings in a mask, that defines the pattern, to form the metal-SiC material thereat. The laser light can be blocked with the mask opposite other interface locations of the metal and the SiC substrate.

In some embodiments according to the invention, forming the metal can include forming a blanket metal on the substrate, wherein laser annealing can include activating a laser opposite the interface locations, according to the pattern, to impinge laser light onto the blanket metal layer at the interface location. The laser can be de-activated opposite other interface locations to avoid annealing at the other locations.

In some embodiments according to the invention, the metal can be nickel, platinum, or titanium. In some embodiments according to the invention, laser annealing can include impinging laser light on the interface locations at an energy and wavelength sufficient to form a silicide of the metal and the SiC substrate.

In some embodiments according to the invention, the SiC substrate can be 6H SiC, wherein laser annealing can include impinging laser light having a wavelength of about 248 nanometers to about 308 nanometers at an energy of about 2.8 joules/cm$^2$ in a single pulse having a duration of about 30 nanoseconds. In some embodiments according to the invention, the SiC substrate can be 4H SiC, wherein laser annealing can include impinging laser light having a wavelength of about 248 nanometers to about 308 nanometers at an energy of about 4.2 joules/cm$^2$ in about five pulses each having a duration of about 30 nanoseconds. In some embodiments according to the invention, the laser light can be photon energies above a bandgap of the SiC substrate. In some embodiments according to the invention, the laser light can be pulsed or continuous wave laser light.

In some embodiments according to the invention, a contact for a light emitting device can include forming a metal on a Silicon Carbide (SiC) layer according to a pattern so that portions of the layer are exposed. Laser light can be impinged on the exposed portions of the SiC layer and on interface locations of the metal and the Si—C layer to form a metal-SiC material thereat corresponding to the pattern. In some embodiments according to the invention, the layer can be a SiC substrate.

In some embodiments according to the invention, the metal can be nickel, platinum, or titanium. In some embodiments according to the invention, the laser annealing can include impinging laser light on the interface locations at an energy and wavelength sufficient to form a silicide of the metal and the SiC substrate.

In some embodiments according to the invention, the SiC substrate can be 6H SiC, wherein the laser annealing can include impinging laser light having a wavelength of about 248 nanometers to about 308 nanometers at an energy of about 2.8 joules/cm$^2$ in a single pulse having a duration of about 30 nanoseconds.

In some embodiments according to the invention, the SiC substrate can be 4H SiC, wherein the laser annealing can include impinging laser light having a wavelength of about 248 nanometers to about 308 nanometers at an energy of about 4.2 joules/cm$^2$ in about five pulses each having a duration of about 30 nanoseconds.

In some embodiments according to the invention, the laser light can include photon energies above a bandgap of the SiC substrate. In some embodiments according to the invention, the laser light can be pulsed or continuous wave laser light.

In some embodiments according to the invention, a method of forming an ohmic contact for a semiconductor device can include forming a photoresist on a SiC layer according to a pattern to expose first portions of the SiC layer and to cover second portions of the substrate. A blanket metal can be formed on the first portions and on the photoresist. Laser light can be impinged on interface locations of the blanket metal and the SiC layer corresponding to the first portions to form a metal-SiC material thereat, whereas impinging laser light on the blanket metal corresponding to the second portions can be avoided.

In some embodiments according to the invention, the method can further include removing metal from the photoresist so that metal-SiC material remains. An overlay can be formed on the metal-SiC material and the photoresist can be removed from the SiC substrate. In some embodiments according to the invention, the method can further include forming an overlay on the metal-SiC material and on the photoresist and removing the photoresist from the SiC layer.

In further embodiments according to the invention, the method can further include lifting-off the photoresist and the metal thereon leaving the metal-SiC material. An overlay can be formed on the metal-SiC material. In some embodiments according to the invention, the metal can be nickel, platinum, or titanium. In some embodiments according to the invention, the laser annealing can include impinging laser light on the interface locations at an energy and wavelength sufficient to form a silicide of the metal and the SiC substrate.

In some embodiments according to the invention, forming a contact can include impinging laser light on an interface location between a metal and a Silicon Carbide (SiC) layer to form a metal-SiC material to provide at least one ohmic contact on the device including opposing ohmic contact boundaries having a non-ohmic contact region therebetween.

In some embodiments according to the invention, a light emitting device (LED) can include at least one metal-Silicon Carbide (SiC) ohmic contact on a SiC layer, the at least one metal-SiC ohmic contact including opposing ohmic contact boundaries having a non-ohmic contact region therebetween.

In some embodiments according to the invention, the opposing ohmic contact boundaries are separated by about 10 um. In some embodiments according to the invention, the at least one ohmic contact can include a plurality of ohmic contacts including respective opposing ohmic contact boundaries defining stripes in a striped pattern forming oblique angles with a side of the device.

In some embodiments according to the invention, the stripes are separated about 106 urn. In some embodiments according to the invention, the at least one ohmic contact can include a plurality of ohmic contacts including respective opposing ohmic contact boundaries defining stripes a striped pattern parallel to a side of the device.

In some embodiments according to the invention, the striped pattern defines a substantially circular shape having a diameter of about 95 um, wherein the stripes are separated by distance of about 4.0 um to about 5.0 um. In some embodiments according to the invention, the at least one ohmic contact can include a plurality of ohmic contacts including respective opposing ohmic contact boundaries defining rings of a concentric circular pattern. In some embodiments according to the invention, the rings are separated by a distance of about 4.0 um to about 5.0 um.

In some embodiments according to the invention, a method of forming an ohmic contact for a semiconductor device can include forming a metal on a Silicon Carbide (SiC) layer and laser annealing the metal and the SiC layer to form a metal-SiC material at interface locations of the metal and the SiC layer. Portions of the metal-SiC material can be removed to expose the SiC layer according to a pattern to provide at least one ohmic contact on the semiconductor device.

In some embodiments according to the invention, a method of forming an ohmic contact for a semiconductor device can be provided by thinning a substrate to provide a reduced thickness substrate and providing a metal on the reduced thickness substrate. Laser annealing can be performed at a location of the metal and the reduced thickness substrate at an energy level to form a metal-substrate material to provide the ohmic contact thereat.

DETAILED DESCRIPTION OF EMBODIMENTS ACCORDING TO THE INVENTION

The present invention now will be described more fully hereinafter with reference to the accompanying drawings, in which embodiments of the invention are shown, However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section (and/or plan view) illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature, As used herein the term "ohmic contact" refers to contacts where an impedance associated therewith is substantially given by the relationship of Impedance=V/I, where V is a voltage across the contact and I is the current, at substantially all expected operating frequencies (i.e., the impedance associated with the ohmic contact is substantially the same at all operating frequencies). For example, in some embodiments according to the invention, an ohmic contact can be a contact with a specific contact resistivity of less than about 10 e −03 ohm-cm$^2$ and, in some embodiments less than about 10 e −04 ohm-cm$^2$. Thus, a contact that is rectifying or that has a high specific contact resistivity, for example, a specific contact resistivity of greater than about 10 e −03 ohm-cm$^2$, is not an ohmic contact as that term is used herein. As used herein, a "metal-SiC material" includes mixtures containing a metal and Silicon Carbide fused together or dissolving into each other when annealed. It will also be understood that, for example, a Ni—SiC material can be a mixture (or alloy) of nickel and silicon carbide when annealed so that a Ni-silicide is formed.

As described herein in greater detail, embodiments according to the invention may provide methods of annealing interface locations of a metal and a silicon carbide substrate to form a metal-silicon carbide material thereat and avoid annealing other locations on the silicon carbide substrate so as to avoid forming a metal silicon carbide material. It will be understood that the interface locations where the metal-silicon carbide material is formed can include boundaries at or near the outer area where the laser light impinges the metal and the substrate. For example, as described in further detail herein in reference to FIG. 21, when the laser light is impinged on the interface, a metal-SiC ohmic contact is formed which includes opposing ohmic contact boundaries and a non-ohmic area therebetween (where for the laser light has directly impinged) a metal-SiC material is formed at an interface location Annealing at one location with, for example a laser beam, while avoiding annealing at another location on the silicon carbide substrate may avoid the type of damage caused by a conventional rapid thermal anneal to an epitaxial layer. For example, in some embodiments according to the invention, metal-silicon carbide ohmic contacts can be formed by annealing the interface locations on the substrate using laser light while avoiding annealing other locations on the substrate (by masking or modulating the laser light) after an epitaxial layer has been formed on the front side of the substrate.

FIGS. 1-4 are cross-sectional views that illustrate the formation of metal-silicon carbide (SiC) ohmic contacts in light emitting devices according to some embodiments of the invention. In particular, one or more epitaxial layers 100 are formed on a front side of a SiC substrate 105. The epitaxial layers 100 may provide an active region of a light emitting device and may be formed of a GaN based material, such as, InGaN, GaAlInN or the like. A metal layer 110 is formed on a back side of the SiC substrate 105 opposite the epitaxial layer 100. It will be understood that the SiC substrate 105 can be any type of SiC material used to form light emitting devices such as 4H or 6H SiC. It will also be understood that the metal layer 110 can be formed to a thickness of about 400 angstroms to about 1100 angstroms. The metal layer 110 can be a metal such as platinum, titanium, or preferably nickel.

Figure 2:
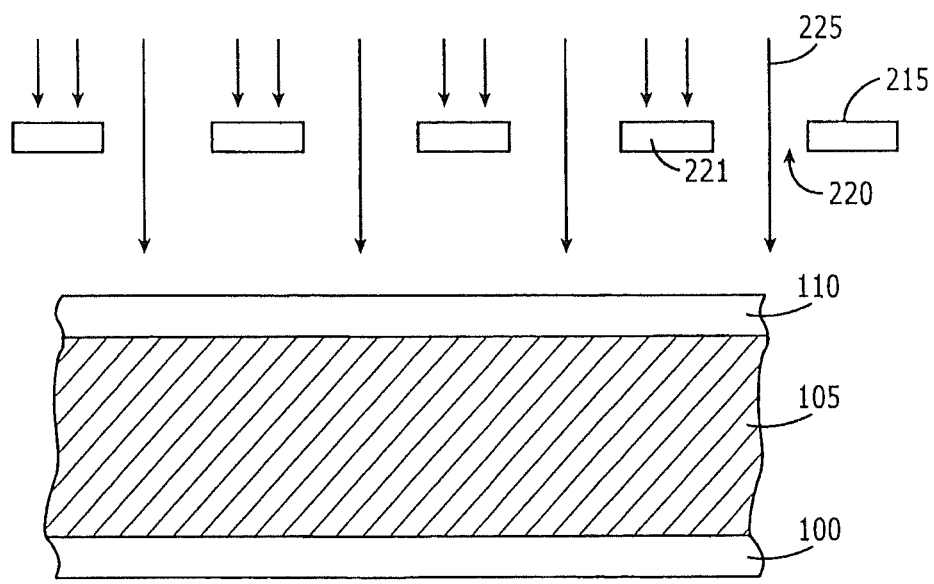

As shown in FIG. 2, laser light 225 is impinged on corresponding interface locations of the metal layer 110 and the SiC substrate 105 through openings 220 in a mask 215. Some of the laser light 225 is blocked by the mask 215 from impinging on other interface locations of the metal layer 110 and the SiC substrate 105.

Figure 3:
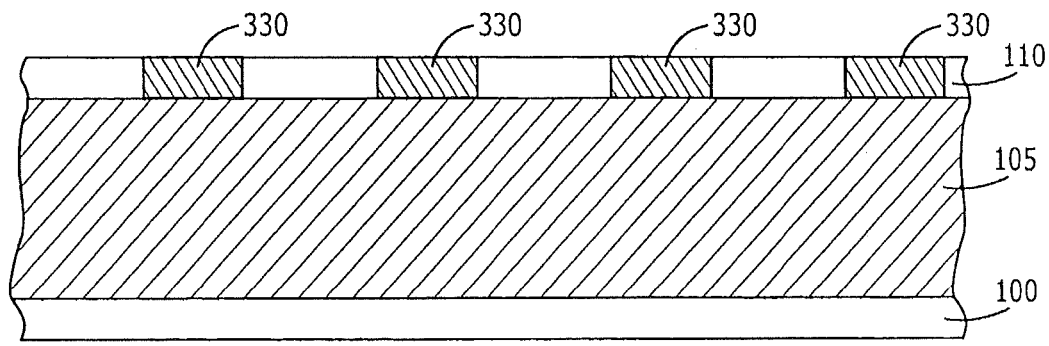

As shown in FIG. 3, interface locations 330 where the laser light 225 impinges the metal layer 110 and the SiC substrate 105 are annealed to form a metal-SiC material thereat. In some embodiments according to the invention, the metal-SiC material at the interface location is formed by the laser light 225 heating the metal and SiC to create a silicide of the metal. Conversely, the other interface locations of the SiC substrate 105 and metal layer 110 that are blocked by the mask 215 are not annealed so that the metal-SiC material is not formed.

Figure 4:
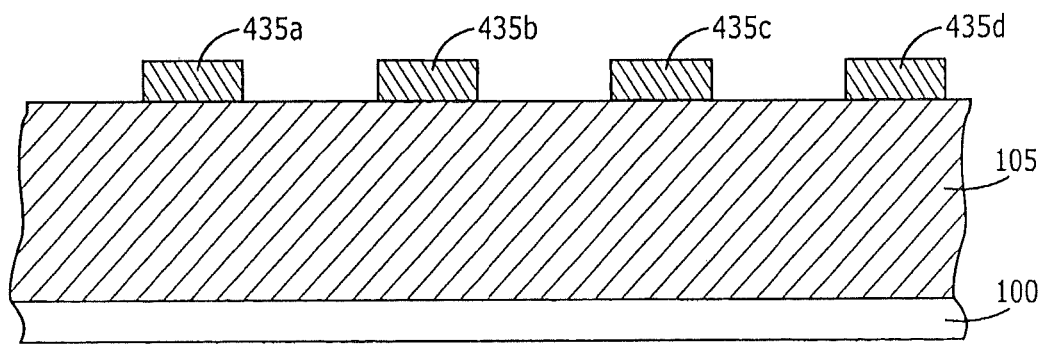

According to FIG. 4, portions of the metal layer 110 that are not annealed by the laser light 225 are removed, using, for example in the case of a nickel metal layer 110, a solution of $HNO_3:3H_2O$ or HCL and $H_2O$. Removal of the unannealed portions of the metal layer 110 exposes annealed metal-SiC ohmic contacts 435a-435d. As described above, in some embodiments according to the invention, the annealed metal-SiC ohmic contacts are formed by annealing interface locations of the metal layer 110 and the SiC substrate 105 whereas annealing of other locations on the substrate 105 is avoided by blocking the laser light from impinging on corresponding locations of the substrate.

Figure 5:
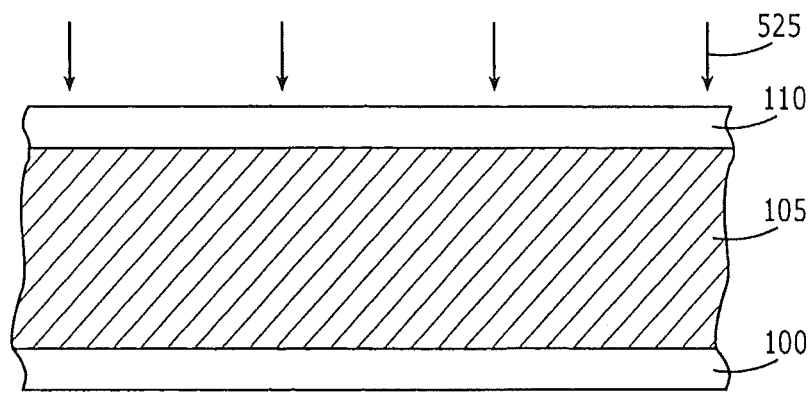
FIGS. 5-7 are cross-sectional views illustrating the formation of metal-silicon carbide ohmic contacts in light emitting devices according to further embodiments of the invention.
Figure 6:
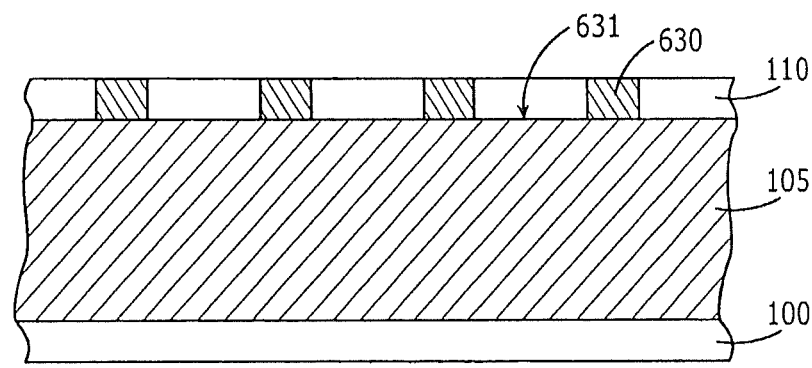
Figure 7:
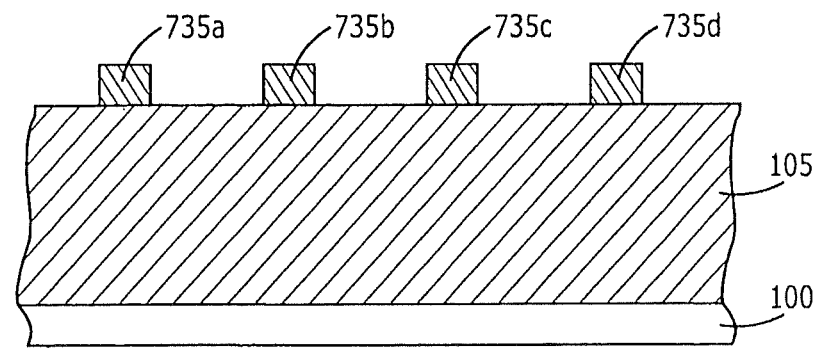

FIGS. 5-7 are cross-sectional views that illustrate methods of forming metal-SiC ohmic contacts according to some embodiments of the invention. As shown in FIG. 5, laser light 525 is impinged on the metal layer 110 according to a predetermined pattern. That is, some interface locations of the metal layer 110 and the underlying substrate 105 are impinged by the laser light 525 whereas other locations are not impinged by the laser light 525. In some embodiments according to the invention, the laser light 525 is impinged on the metal layer 110/substrate 105 by moving a laser beam above the metal layer 110 and activating/deactivating the laser to produce the laser light 525 according to the desired pattern. It will be understood that the laser beam may be activated/de-activated by pulsing the laser on/off or by modulating the laser beam to form the metal-SiC material where desired and to avoid the formation of the metal-SiC material otherwise.

Regarding "moving" the laser beam described above, it will be understood that in some embodiments according to the invention, the laser beam can be moved in discreet steps according to the pattern whereas in other embodiments according to the invention, the laser beam is moved continuously and activated/deactivated at the appropriate intervals according to the pattern. It will be further understood that the laser beam can be "moved" by, for example, moving a mirror above the metal layer 110 to reflect the laser beam. Alternatively, the laser that generates the laser beam may be moved above the metal layer.

Figure 28:
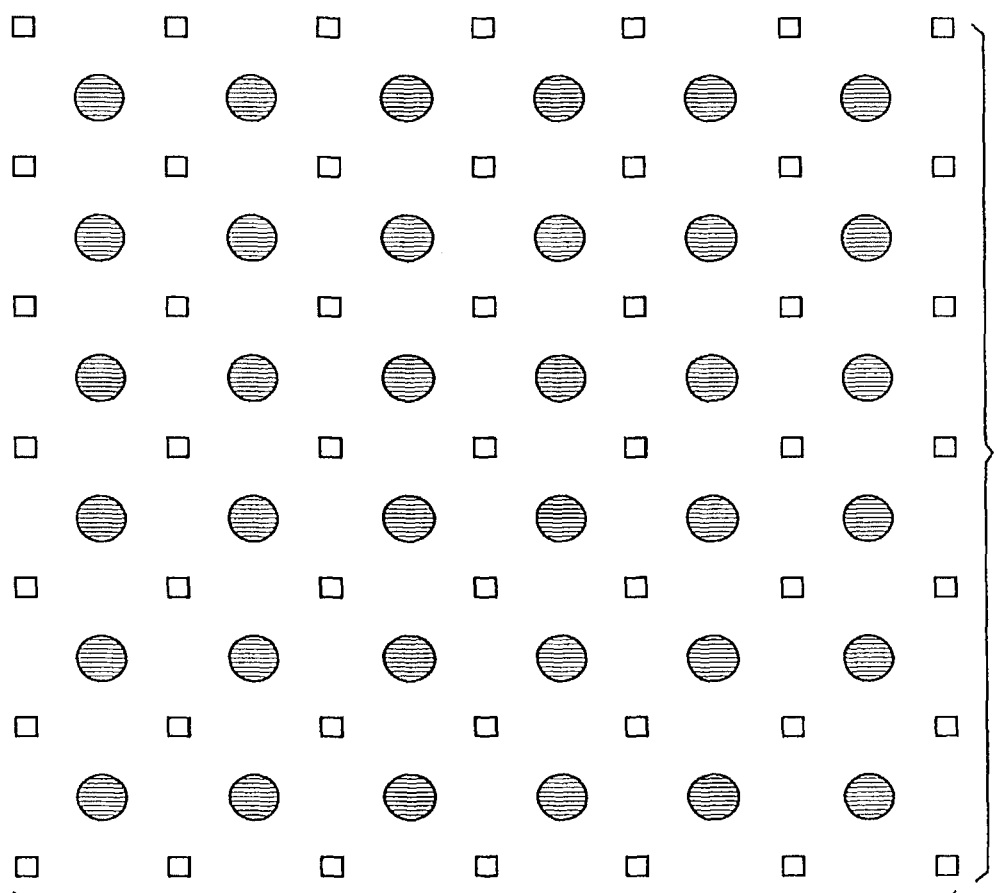
FIG. 28 is an exemplary laser mask through which laser light can be projected to anneal metal-SiC ohmic contacts according to some embodiments according to the invention.

In still other embodiments according to the invention, the substrate can be moved beneath a "fixed" laser beam. For example, the substrate can be moved in increments of the mask pitch and stopped at each location where the laser is activated for a number of pulses (or duration) at each location. In some embodiments according to the invention, a 1.8 mm×1.8 mm field is used for a 6×6 array of 300 um pitch die. Alternatively, the substrate can be moved beneath a fixed beam continuously along one axis, with activation of the laser beam being synchronized at every die pitch, which may vary by device. The number of pulses delivered to each site can be based on the number of die positions in the mask along the axis along which the substrate is moved. The wafer may then be indexed by the mask pitch along the non-scanned axis, whereupon the scanning can be repeated. FIG. 28 illustrates an exemplary laser mask through which laser light can be projected to anneal metal-SiC ohmic contacts according to some embodiments according to the invention.

As shown in FIG. 6, the interface locations of the metal layer 110 and the substrate 105 that are impinged by the laser light 525 are annealed to form a metal-SiC material 630 thereat. It will be understood that the other interface locations 631 upon which laser light 525 does not impinge remain unannealed. According to FIG. 7, the unannealed portions of the metal layer 110 are removed using, for example an etching solution described above in reference to FIG. 4, to expose annealed metal-SiC ohmic contacts 735a-d. Accordingly, in some embodiments according to the invention, the annealed metal-SiC ohmic contacts are formed by impinging laser light at interface locations of the metal layer and the underlying SiC substrate according to a pattern. Annealing of other interface locations of the metal layer and the SiC substrate can be prevented by avoiding impinging the laser light on those corresponding portions of the metal layer and substrate.

Figure 8:
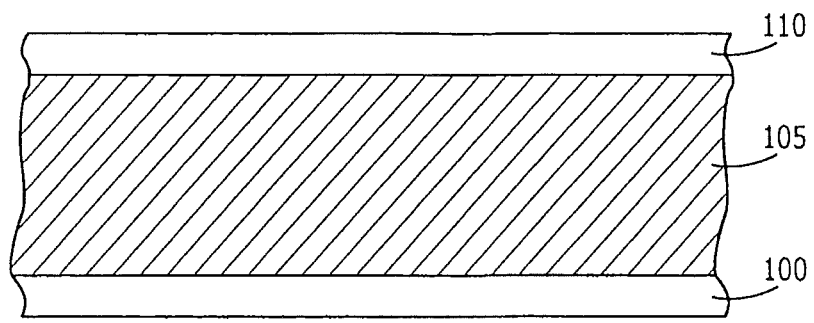
FIGS. 8-11 are cross-sectional views illustrating the formation of metal-silicon carbide ohmic contacts in light emitting devices according to further embodiments of the invention.
Figure 9:
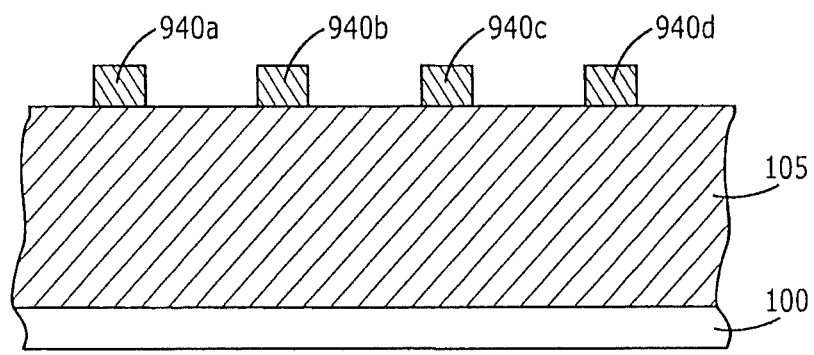

FIGS. 8-11 are cross-sectional views illustrating methods of forming metal-SiC ohmic contacts in light emitting devices according to some embodiments of the invention. In FIG. 8, a metal layer 110 is formed on a SiC substrate 105 opposite an epitaxial layer(s) 100. The metal layer 110 is patterned, using for example a lift-off or etching process, and portions thereof are removed so that portions of the metal layer 940a-940d remain on the substrate 105 having exposed portions of the substrate therebetween, as shown in FIG. 9. Accordingly, the remaining portions 940a-d of the metal layer 110 include interface locations with the underlying SiC substrate 105.

Figure 10:
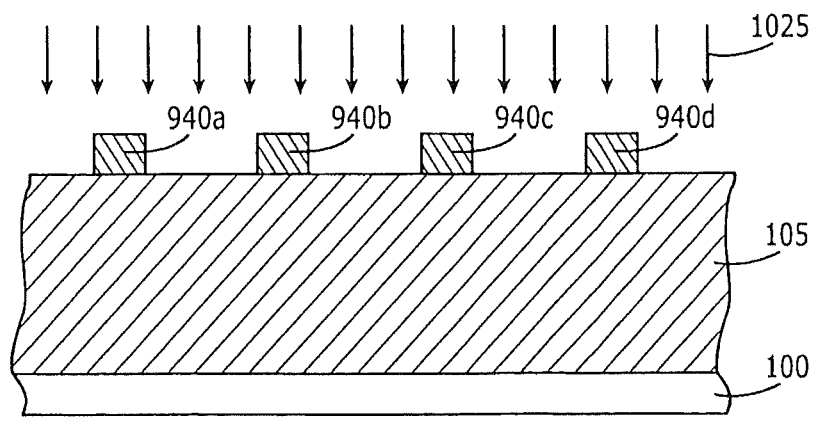
Figure 11:
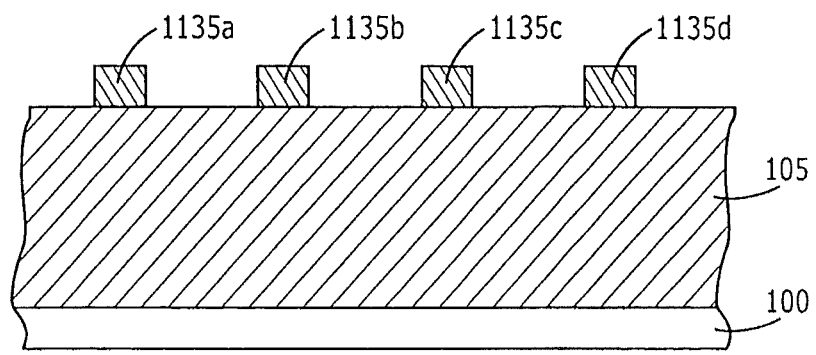
Figure 12:
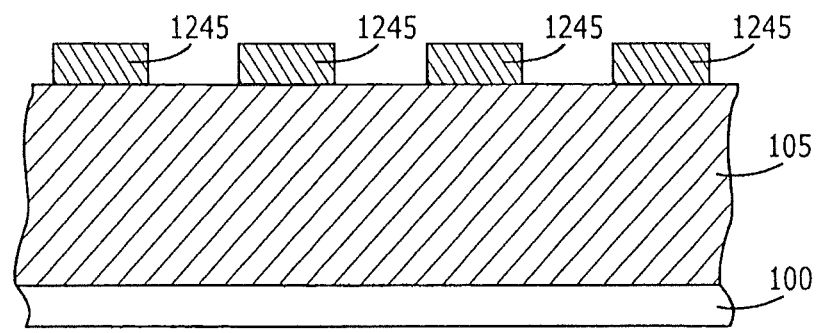
FIGS. 12-17 are cross-sectional views illustrating the formation of metal-silicon carbide ohmic contacts in light emitting devices according to further embodiments of the invention.
Figure 13:
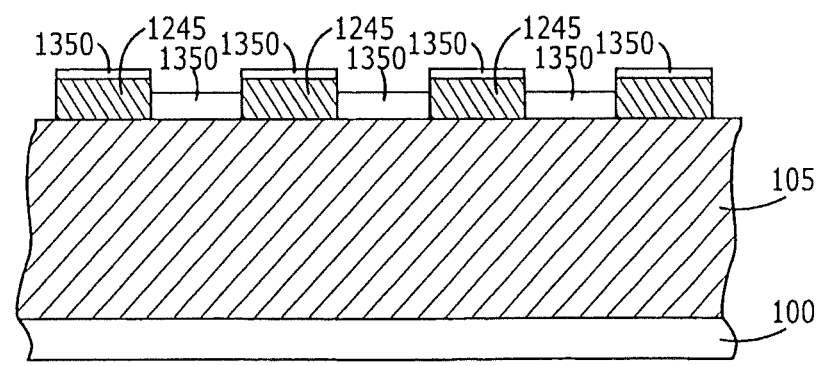

As shown in FIG. 10, laser light 1025 is impinged on the remaining portions 940a-d of the metal layer 110 and on the exposed portions of the SiC substrate 105 therebetween. The laser light 1025 anneals the remaining portions 940a-940d of the metal layer 110 to form annealed metal-SiC ohmic contacts 1135a-1135d on the substrate according to the pattern described above in reference to FIG. 9. Accordingly, in some embodiments according to the invention, the metal-SiC ohmic contacts are annealed by forming remaining metal portions from the metal layer according to a pattern and laser light is impinged upon both the remaining metal portions and the exposed SiC substrate so that the formation of the metal-SiC material is avoided in locations other than those corresponding to the remaining metal portions.

It will be understood by those skilled in the art, given the benefit of this disclosure, that the laser light 1025 should preferably not damage the boundaries of the metal-SiC ohmic contacts 1135a-1135d that are formed as described above. In particular, if un-addressed, laser light 105 that impinges on the exposed portions of the SiC substrate 105 could damage the adjacent metal-SiC ohmic contacts 1135a-1135d. As described in reference to FIG. 24, the ohmic contacts can include opposing metal-SiC ohmic contact boundaries near or at the outer edges of where the laser light impinges the interface of the metal and SiC substrate. In some embodiments according to the invention, the eradication of the metal-SiC ohmic contacts may be avoided by, for example, reducing the power of the laser light 1025 adjacent to the metal-SiC ohmic contacts. In some embodiments according to the invention, the wavelength of the laser light may be changed to avoid eradicating the adjacent metal-SiC ohmic contacts.

FIGS. 12-17 are cross-sectional views that illustrate methods of forming annealed SiC ohmic contacts according to further embodiments of the invention. A layer of photoresist pattern 1245 is formed on the SiC substrate 105 according to a pattern so that portions of the substrate 105 remain covered by the photoresist 1245 whereas other portions of the SiC substrate 105 are exposed. According to FIG. 13, a metal layer 1350 is formed on the photoresist pattern 1245 separated from the underlying SiC substrate 105 and on the exposed portions of the substrate 105 to define interface locations of the metal 1350 and the SiC substrate 105.

Figure 14:
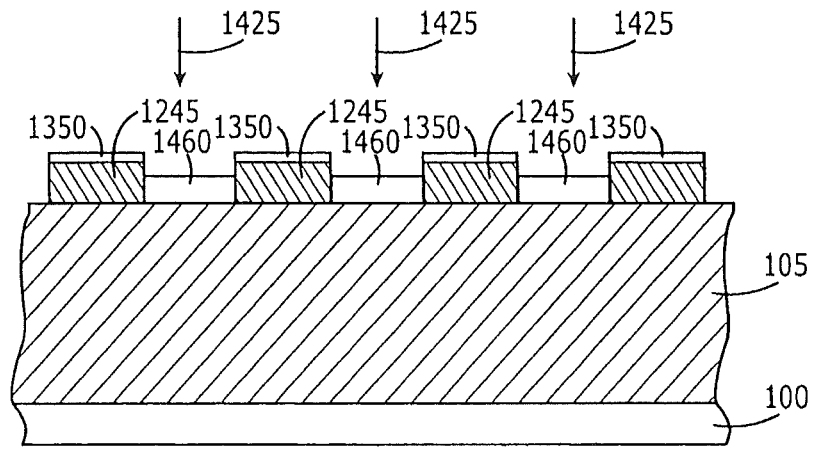
Figure 15:
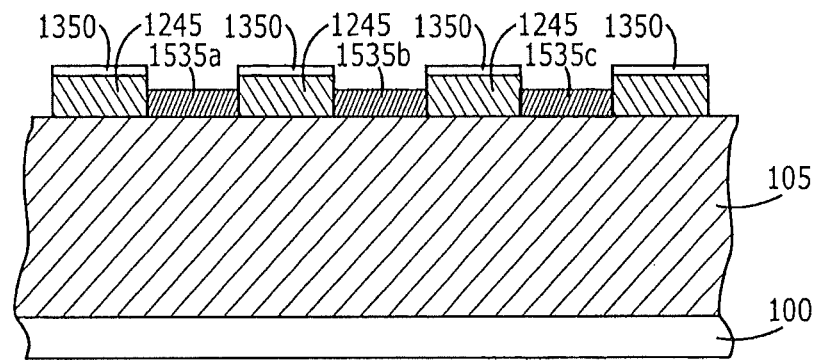

As shown in FIG. 14, laser light 1425 is impinged upon interface locations 1460 on the exposed portions of the SiC substrate 105. The laser light 1425 anneals the metal 1350 on the exposed portions of the SiC substrate 105 at the interface locations 1460 so that a metal-SiC material 1535a-d is formed thereat as shown in FIG. 15. In some alternative embodiments according to the invention, the laser light 1425 may also be impinged upon the metal layer 1350 on the photoresist pattern 1245, however, the metal layer 1350 and the photoresist pattern 1245 may be damaged by the laser light 1425.

Figure 16:
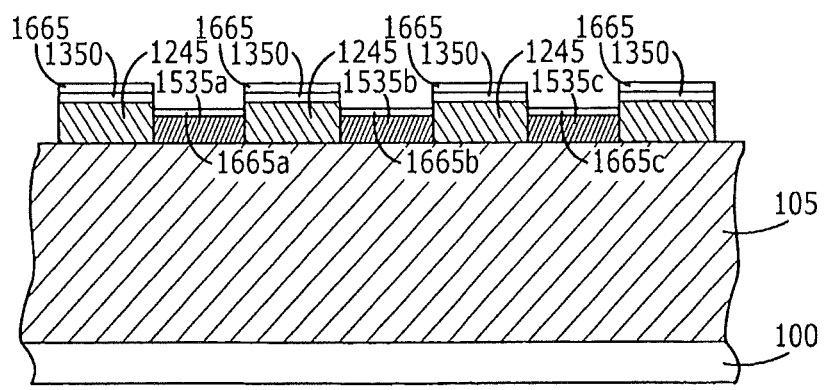
Figure 17:
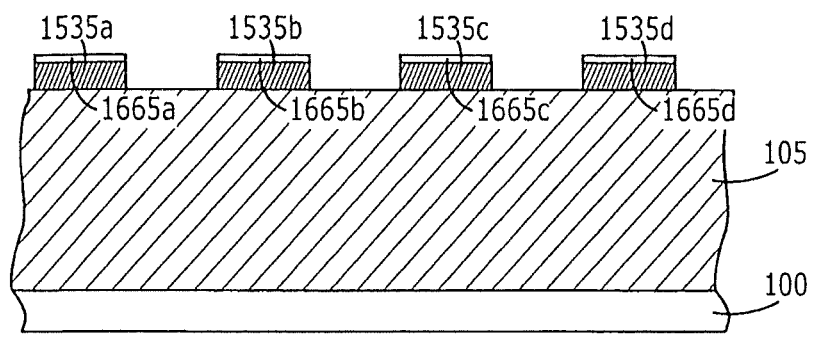

According to FIG. 16, an overlay 1665 is formed on the metal on the photoresist pattern 1245 and on the metal-SiC (SiC) material 1535a-1535d. The photoresist pattern 1245 and the metal 1350 thereon (including the corresponding portion of the overlay 1665) can be removed using a lift-off process including, for example, etching the photoresist pattern to remove the photoresist, the metal and overlay thereon as shown in FIG. 17.

It will be understood that in some embodiments according to the invention, the laser light 1425 described above in reference to FIG. 14, can be impinged subsequent to formation of the overlay pattern 1665 illustrated in FIG. 16. Furthermore, the overlay 1665 and the metal 1350 located on the photoresist pattern 1245 may be removed in separate steps rather than together as described above in reference to FIG. 16.

Figure 18:
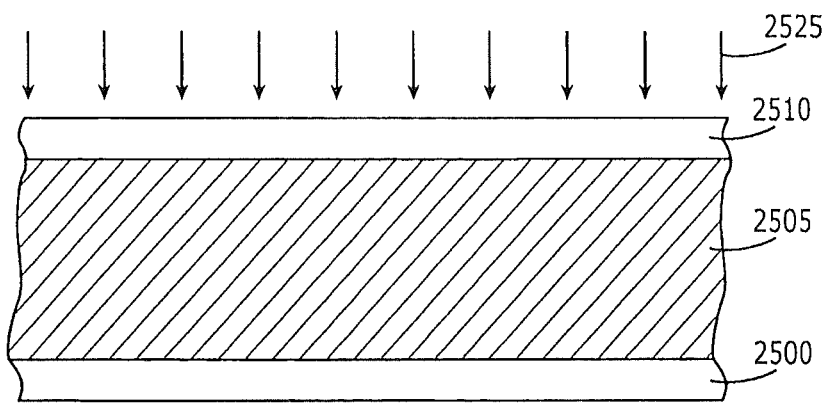
FIGS. 18-20 are cross-sectional views illustrating the formation of metal-silicon carbide ohmic contacts in light emitting devices according to further embodiments of the invention.
Figure 19:
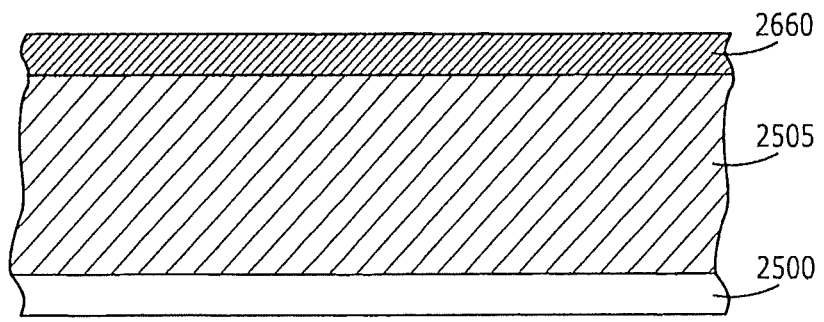
Figure 20:
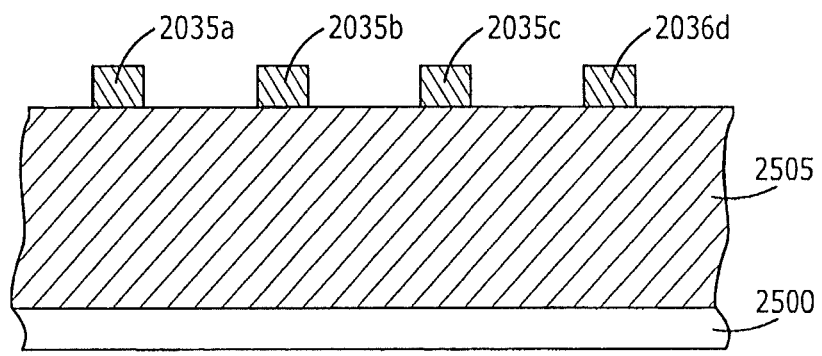

FIGS. 18-20 are cross-sectional views illustrating the formation of metal-silicon carbide ohmic contacts in light emitting devices according to further embodiments of the invention. According to FIGS. 18 and 19, laser light 2525 is impinged on a metal 2510/SiC substrate 2505 in a blanket pattern to form an annealed metal-SiC layer 2660. Portions of the annealed metal-SiC layer 2660 are removed so that the remaining portions of the annealed metal-SiC layer 2660 form the metal-SiC ohmic contacts as shown in FIG. 20, It will be understood that the removal of portions of the metal layer can be performed using, for example, Reactive Ion Etching and photolithography techniques known to those skilled in the art. Accordingly, the metal-SiC ohmic contacts according to some embodiments of the invention can be formed using a blanket anneal via the laser light whereas annealing can be avoided by removing portions of the metal according to a pattern.

Figure 21:
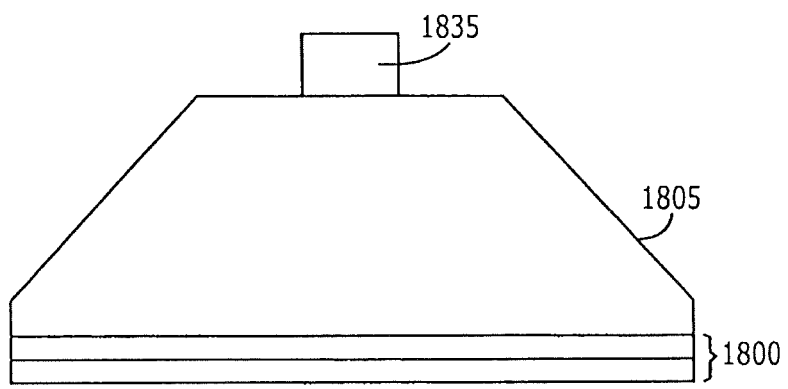
FIGS. 21 and 22 are cross-sectional views of metal-silicon carbide ohmic contacts in light emitting devices formed according to some embodiments of the invention.
Figure 22:
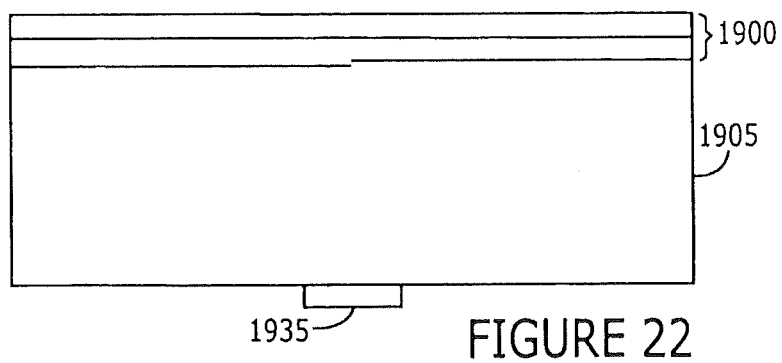

FIGS. 21 and 22 are cross-sectional views that illustrate light emitting devices including metal-SiC (SiC) ohmic contacts formed according to embodiments of the invention. In particular, FIG. 21 illustrates an annealed metal-SiC ohmic contact 1835 on a beveled edge SiC substrate 1805 opposite a stack of n/p type epitaxial layers 1800. The reduced thickness of the substrate 1805 may allow a saw tip to eliminate an upper portion of the substrate 1805 when the wafer is diced. The formation of such beveled edge devices is described, for example, in the U.S. Pat. No. 5,087,949, and U.S. patent application Ser. No. 10/659,241, filed Sep. 9, 2003, by Slater et al., the disclosures of which are incorporated herein by reference in their entireties.

FIG. 22 illustrates a straight cut light emitting device including an annealed metal-SiC ohmic contact formed according to embodiments of the invention. In particular, an annealed metal-SiC ohmic contact 1935 is located on a substrate 1905 opposite a stack of n/p type epitaxially formed layers 1900. The structures shown in FIGS. 21 can produce higher light output and higher light extraction. Furthermore, the structure of FIG. 21 may promote more conformal phosphor coatings to promote white light conversion efficiency due to the reduced thickness.

Figure 23:
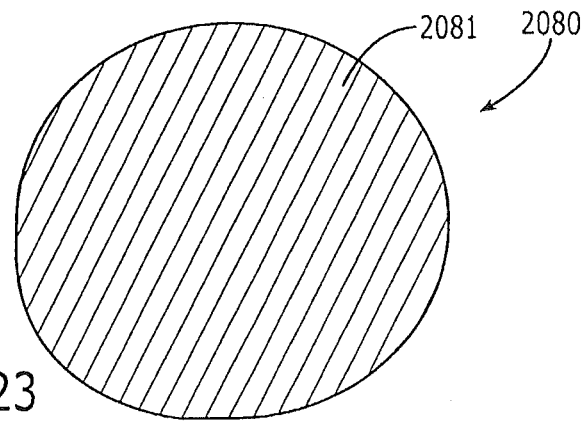
FIG. 23 is a schematic plan view of a silicon carbide substrate subject to laser annealing according to some embodiments of the invention.

FIG. 23 is a schematic plan view of a wafer 2080 having been annealed as described above in reference to FIGS. 1-20, In particular, pattern lines 2081 represent a laser light pattern used to anneal the metal-SiC ohmic contacts thereon according to some embodiments of the invention. As described above, the light can be impinged upon a metal layer on the wafer 2080 according to the pattern lines 2081. Alternatively, the pattern lines 2081 may be generated according by activating and deactivated the laser light according to a pattern or impinged on the substrate through openings in a mask. Furthermore, the light may be impinged upon a substrate having a photoresist pattern and a metal thereon.

Figure 24:
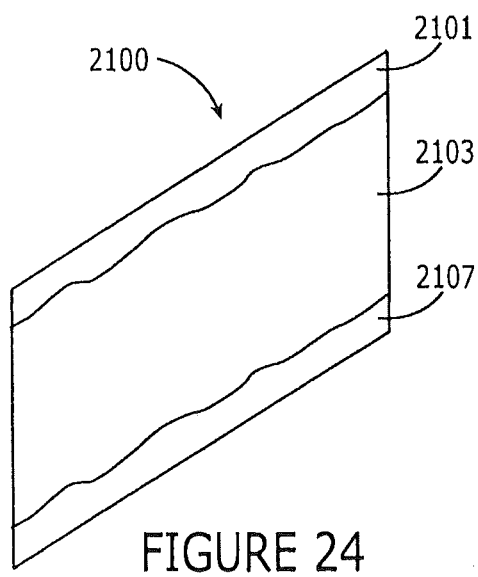
FIG. 24 is a simplified schematic view of a metal-silicon carbide ohmic contact including respective opposing ohmic contact boundaries according to some embodiments of the invention.

FIG. 24 is a detailed view of a metal-SiC ohmic contact according to some embodiments of the invention. In particular, a metal-SiC ohmic contact 2100 includes opposing metal-SiC ohmic contact boundaries 2101, 2102 having a non-ohmic contact region 2103 therebetween. As appreciated by the present inventors, when laser light impinges the interface location of the SiC substrate and overlying metal layer, the metal-SiC material is formed proximate at the boundaries of where the laser light impacts the interface location. For example, as shown in FIG. 24, the ohmic contact boundaries 2101 and 2102 define an outer area where the laser light has impinged at the interface location of the metal layer in the SiC substrate.

Therefore, in some embodiments according to the invention, the ohmic contact boundaries 2101 and 2102 define the annealed metal-SiC ohmic contact where the non-ohmic contact region 2103 is included between the opposing ohmic contact boundaries 2101, 2102. It will be understood that the non-ohmic contact region, 2103 is also impinged by the laser light that anneals the interface location to form a metal-SiC at the opposing ohmic contact boundaries 2101, 2102. It will also be understood that the shape of the opposing ohmic contact boundaries 2101, 2102 can vary with the properties of the laser light used. For example, the laser light may be de-focused to provide the un-even contours shown in FIG. 24 or focused to provide contours that are relatively narrow and relatively even in width compared to those shown in FIG. 24. It will be understood, however, that the un-even contours shown in FIG. 24 are exemplary in nature and are not limited to those illustrated, In still other embodiments according to the invention, some edges in the laser mask can include features that measure less than a resolution of a lens (e.g., about 2 um) used to direct the laser light, which is sometime referred to as "softening" the edges of the mask. In particular, the softening of the edges can cause the energy of the laser light to be gradually reduced toward the edges of the image produced by the mask. Reducing the energy near the edges can increase the density of the feature edges produced by the laser light projected through the mask. Exemplary Mask features are shown in FIG. 29A. FIG. 29B shows a detailed view of a portion of the edges of the mask shown in FIG. 29A according to some embodiments according to the invention.

Figure 25:
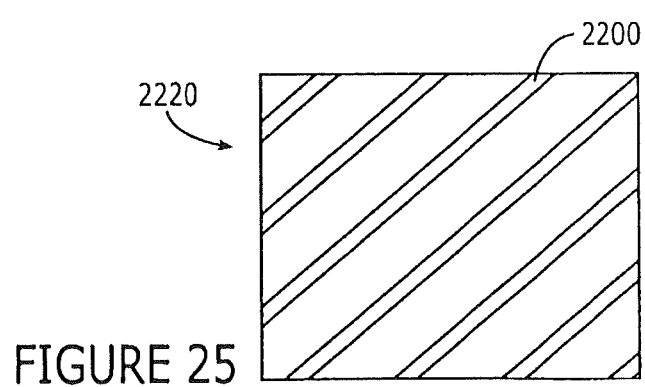
FIG. 25 is a simplified schematic plan view of a plurality of metal-silicon carbide ohmic contacts defining an oblique striped pattern according to some embodiments of the invention.

FIG. 25 is a simplified plan view showing a plurality of metal-SiC ohmic contacts 2200 that form an oblique angle with a side of the device 2270. It will be understood that each of the stripes included in the plurality of metal-SiC ohmic contacts 2200 include opposing metal-SiC ohmic contact boundaries and non-ohmic contact regions therebetween, as illustrated for example, in FIG. 24.

Figure 26:
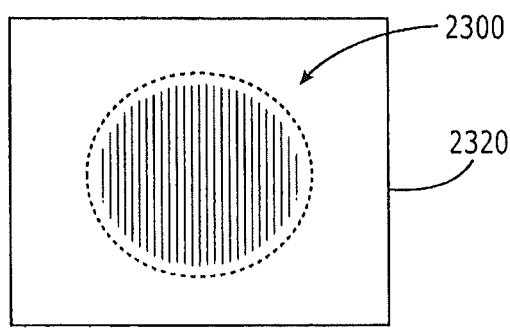
FIG. 26 is a simplified schematic plan view of a plurality of metal-silicon carbide ohmic contacts defining a striped circular pattern according to some embodiments of the invention.

FIG. 26 is a simplified plan view of a plurality of metal-SiC ohmic contacts defining a striped circular pattern 2300 wherein the stripes are parallel to a side of the device 2370. It will be understood that each of the stripes in the pattern 2300 includes respective opposing metal-SiC ohmic contact boundaries and non-ohmic contact regions therebetween, as illustrated for example in FIG. 24.

Figure 27:
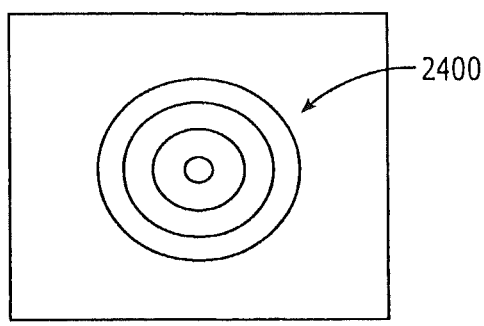
FIG. 27 is a simplified schematic plan view of a plurality of metal-silicon carbide ohmic contacts defining a ringed circular pattern according to some embodiments of the invention.

FIG. 27 is a simplified plan view of a pattern of metal-SiC ohmic contacts defining a circular concentric ring pattern 2400. It will be understood that each of the rings in the pattern 2400 include metal-SiC opposing ohmic contact boundaries and non-ohmic contact regions therebetween, as illustrated for example in FIG. 24.

It will be understood that in some embodiments according to the invention, the stripes or rings included in the metal-SiC ohmic contacts described above in reference to FIGS. 23-27, can be formed having various thicknesses and spacing therebetween. For example, in some embodiments according to the invention, the stripes in the metal-SiC ohmic contacts can have a width of about 10 microns and a spacing therebetween of about 100 microns or 106 microns. In other embodiments according to the invention, the spacing between the stripes can be about 4 to about 5 microns where the stripes are arranged in a substantially circular pattern having a diameter of about 95 microns, as illustrated for example in FIG. 26, or the concentric rings illustrated in FIG. 27. It will also be understood that although the stripe patterns shown in FIGS. 25-27 are shown separately, the stripe patterns may be combined to form metal-SiC ohmic contacts as described herein.

It will be understood that the laser light used to anneal the metal-SiC ohmic contacts described herein can be a laser light having a wavelength and intensity sufficient to form the metal-silicide material at the interface of the metal layer and the SiC substrate. For example, in embodiments using 6H SiC as the substrate, laser annealing may be accomplished by impinging laser light having a wavelength of about 248 nanometers to about 308 nanometers at an energy of about 2.8 joules per square centimeter in a single pulse having a duration of about 30 nanoseconds. In other embodiments according to the invention where, for example, the SiC substrate is 4H SiC, the laser light may have a wavelength of about 248 nanometers to about 308 nanometers and an energy of about 4.2 joules per square centimeter applied in about 5 pulses, each having a duration of about 30 nanoseconds. In still other embodiments according to the invention, other wavelengths and energies may be used to provide annealing at the interface location of the metal layer and the SiC substrate via absorption of light including photon energies that are above the bandgap of the SiC substrate. It will be understood that pulse and/or continuous loop lasers may also be utilized.

It will be also understood that electron beam annealing may be used as an alternative to laser light. Accordingly, in each of the embodiments described above, an electron beam may be used to anneal the interface locations of the metal layer and the SiC substrate to form the metal-SiC material thereat. It will be understood that the metal-SiC ohmic contacts can be a contact for any SiC device and may be included on a SiC epitaxial layer.

Many alterations and modifications may be made by those having ordinary skill in the art, given the benefit of the present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed:

1. A method of forming an ohmic contact for a semiconductor device, comprising:
    thinning a substrate to provide a reduced thickness substrate;
    providing a metal on the reduced thickness substrate; and
    laser annealing a location of the metal and the reduced thickness substrate at an energy level to form a metal-substrate material to provide the ohmic contact thereat to form the ohmic contact having a specific contact resistivity of less than about 10 e −03 ohm-cm$^2$.

2. A method according to claim 1 wherein the metal-substrate material comprises a metal-Silicon Carbide (SiC) material.

3. A method according to claim 1 wherein the location comprises a first interface location of the metal and the reduced thickness substrate, wherein laser annealing comprises:
    laser annealing according to a pattern to avoid laser annealing a second location of the metal and the reduced thickness substrate to avoid forming the metal-substrate material at the second location.

4. A method according to claim 3, further comprising:
    removing the metal from the second location so that the ohmic contact remains on the reduced thickness substrate.

5. A method according to claim 1, wherein the location comprises a first interface location of the metal and the reduced thickness substrate, wherein laser annealing comprises:
    impinging laser light through an opening in a mask onto the metal at the first interface location and blocking the laser light with the mask opposite a second interface location of the metal and the reduced thickness substrate to avoid laser annealing the second interface location.

6. A method according to claim 5, further comprising:
    removing the metal from the second interface location so that the ohmic contact remains on the reduced thickness substrate.

7. A method according to claim 1 wherein providing a metal on the reduced thickness substrate comprises forming a pattern from the metal on the reduced thickness substrate to provide a metal pattern including portions of the metal pattern where the metal is absent, wherein laser annealing comprises:
    laser annealing the metal pattern and the reduced thickness substrate to forming the metal-substrate material.

8. A method according to claim 1 further comprising:
    forming a photoresist on the reduced thickness substrate according to a pattern to expose first portions of the reduced thickness substrate and to cover second portions of the reduced thickness substrate;
    wherein providing a metal on the reduced thickness substrate comprises forming a blanket metal on the first portions and on the photoresist;
    wherein laser annealing comprises impinging laser light on locations of the blanket metal and the reduced thickness substrate corresponding to the first portions to form a metal-substrate material thereat and avoiding impinging laser light on the blanket metal corresponding to the second portions to avoid forming the metal-substrate material thereat.

9. A method according to claim 8 further comprising:
    removing the blanket metal from the photoresist so that metal-substrate material remains;
    forming an overlay on the metal-substrate material; and
    removing the photoresist from the second portions.

10. A method according to claim 8 further comprising:
    forming an overlay on the metal-substrate material and on the photoresist; and
    removing the photoresist from the second portions.

11. A method according to claim 8 further comprising:
lifting-off the photoresist and the blanket metal thereon leaving the metal-substrate material; and
forming an overlay on the metal-substrate material.

12. A method according to claim 1 further comprising:
dicing the reduced thickness substrate to provide a separate semiconductor device having the ohmic contact thereon.

13. A method according to claim 1 wherein laser annealing comprises laser annealing at the energy level above a bandgap of the reduced thickness substrate.

14. A method according to claim 1 wherein laser annealing comprises laser annealing at the energy level above a bandgap of the reduced thickness substrate to form the ohmic contact having a specific contact resistivity of less than about 10 e −04 ohm-cm$^2$.

15. A method according to claim 1 wherein the semiconductor device includes a side wall comprising an oblique portion and a vertical portion.

16. A method according to claim 15 wherein the oblique portion defines about a 30 degree angle relative to the vertical portion.

17. A method according to claim 15 wherein the oblique portion comprises a thickness of about 150 microns and the vertical portion comprises a thickness of about 25 microns.

18. A method according to claim 1 wherein the semiconductor device includes a beveled upper side wall portion and a vertical lower side wall portion.

19. A method according to claim 1 wherein the reduced thickness substrate comprises a thickness of less than about 250 microns.

20. A method according to claim 1 wherein the reduced thickness substrate comprises a thickness of less than about 175 microns.

21. A method of forming an ohmic contact for a semiconductor device, comprising:
providing a metal on a reduced thickness layer, the reduced thickness layer comprising a first material, wherein the reduced thickness layer has a thickness of less than about 250 microns; and
laser annealing a location of the metal and the reduced thickness layer at an energy level above a bandgap of the reduced thickness layer to form a metal-first material material to provide the ohmic contact thereat.

22. A method according to claim 21 wherein the metal-first material material comprises a metal-Silicon Carbide (SiC) material.

23. A method according to claim 21 wherein the location comprises a first interface location of the metal and the reduced thickness layer, wherein laser annealing comprises:
laser annealing according to a pattern to avoid laser annealing a second location of the metal and the reduced thickness layer to avoid forming the metal-first material material at the second location.

24. A method according to claim 23, further comprising:
removing the metal from the second location so that the ohmic contact remains on the reduced thickness layer.

25. A method according to claim 21, wherein the location comprises a first interface location of the metal and the reduced thickness layer, wherein laser annealing comprises:
impinging laser light through an opening in a mask onto the metal at the first interface location and blocking the laser light with the mask opposite a second interface location of the metal and the reduced thickness layer to avoid laser annealing the second interface location.

26. A method according to claim 25, further comprising:
removing the metal from the second interface location so that the ohmic contact remains on the reduced thickness layer.

27. A method according to claim 21 wherein providing a metal on the reduced thickness layer comprises forming a pattern from the metal on the reduced thickness layer to provide a metal pattern including portions of the metal pattern where the metal is absent, wherein laser annealing comprises:
laser annealing the metal pattern and the reduced thickness layer to forming the metal-first material material.

28. A method according to claim 21 further comprising:
forming a photoresist on the reduced thickness layer according to a pattern to expose first portions of the reduced thickness layer and to cover second portions of the reduced thickness layer;
wherein providing a metal on the reduced thickness layer comprises forming a blanket metal on the first portions and on the photoresist;
wherein laser annealing comprises impinging laser light on locations of the blanket metal and the reduced thickness layer corresponding to the first portions to form a metal-first material material thereat and avoiding impinging laser light on the blanket metal corresponding to the second portions to avoid forming the metal-first material material thereat.

29. A method according to claim 28 further comprising:
removing the blanket metal from the photoresist so that metal-first material material remains;
forming an overlay on the metal-first material material; and
removing the photoresist from the second portions.

30. A method according to claim 28 further comprising:
forming an overlay on the metal-first material material and on the photoresist; and
removing the photoresist from the second portions.

31. A method according to claim 28 further comprising:
lifting-off the photoresist and the blanket metal thereon leaving the metal-first material material; and
forming an overlay on the metal-first material material.

32. A method according to claim 21 further comprising:
dicing the reduced thickness layer to provide a separate semiconductor device having the ohmic contact thereon.

33. A method according to claim 21 wherein laser annealing comprises laser annealing to form the ohmic contact having a specific contact resistivity of less than about 10 e −03 ohm-cm$^2$.

34. A method according to claim 31 wherein laser annealing comprises laser annealing to form the ohmic contact having a specific contact resistivity of less than about 10 e −04 ohm-cm$^2$.

35. A method according to claim 21 wherein the semiconductor device includes a side wall comprising an oblique portion and a vertical portion.

36. A method according to claim 21 wherein the semiconductor device comprises a light emitting device.

* * * * *